United States Patent

[11] 3,575,662

[72] Inventor Elden R. Davisson
Columbus, Ind.

[21] Appl. No. 738,957
[22] Filed June 21, 1968
[45] Patented Apr. 20, 1971

[73] Assignee Arvin Industries, Inc.
Columbus, Ind.

[54] ELECTRONIC SEARCH-TUNING SYSTEM
17 Claims, 2 Drawing Figs.

[52] U.S. Cl. ........ 325/470, 334/15
[51] Int. Cl. ........ H03j 3/18, H04b 1/28
[50] Field of Search ........ 325/470; 334/15

[56] References Cited
UNITED STATES PATENTS

| | | | |
|---|---|---|---|
| 3,041,451 | 6/1962 | Laing | 325/470 |
| 3,189,829 | 6/1965 | Bento | 325/470 |
| 3,467,870 | 9/1969 | Aoyama | 325/470 |

*Primary Examiner*—Bernard Konick
*Assistant Examiner*—Howard W. Britton
*Attorney*—Trask, Jenkins and Hanley

ABSTRACT: A circuit for use in electronically sweeping the tuning capacitors of a radio receiver through their capacitance range for successively tuning in each station. The sweeping action stops automatically and the value of the tuning capacitors are held constant at each station which is picked up by the radio. The sweep function is restarted to drive the tuner toward the next higher frequency station by means of a manually operated switch. The tuning capacitors comprise voltage variable capacitance diodes which are varied by means of a ramp voltage supplied by a generator. The generator is formed by a PNP transistor which charges a capacitor to provide the ramp voltage, and by a first field effect transistor which controls the base current of the PNP transistor. A silicon controlled rectifier is connected in parallel with the capacitor at the output of the ramp generator to discharge the capacitor after it has reached the peak voltage level required to vary the diode's capacitance. In the case of an FM radio, said first field effect transistor has its gate electrode coupled for bias control by a ratio detector in the IF strip of the FM receiver. The output of the ratio detector causes the ramp voltage to level off, when a station is tuned in, by establishing the currents in the transistors so that the charging current to the ramp generator capacitor ceases, thereby holding constant the voltage to the tuning diode. In the case of an AM radio, the IF frequency developed in the AM receiver is passed through a series circuit formed by a narrow band filter, an amplifier, and a rectifier, to provide a DC voltage which is applied to the base electrode of the PNP ramp generator transistor. The DC voltage at said base electrode becomes more positive as a station is tuned in, and the PNP transistor decreases its conduction so that the ramp function ceases and the output voltage to the tuning diodes remain constant.

INVENTOR
ELDEN R. DAVISSON
BY
Trask, Jenkins & Hanley
ATTORNEYS

ELECTRONIC SEARCH-TUNING SYSTEM

BACKGROUND OF THE INVENTION

Several pushbutton tuning devices for radio receivers are known in the prior art. For example, mechanical pushbutton tuning is used extensively in automobile radios in the U.S. Such devices allow the operator to select one of a group of predetermined stations by merely pressing a button corresponding to the selected station. Movement of one of the buttons causes mechanical means within the radio to rotate the tuning capacitor to tune in the selected station. Some radios have a search-tuning device whereby the operator can press a button which actuates a motor to drive a tuning capacitor from one station to the next. The motor is connected to automatically stop at the station adjacent that which was tuned in when the button was pressed. If the operator does not want that station, he can simply press the button again and again until the tuning capacitor tunes in the station he desires. The requirement of mechanical means, or of a motor for driving the variable tuning capacitor, necessitates a relatively large volume for packaging the required components. Furthermore, in the case of the motor driven capacitor, if the radio involved is an AM/FM radio, then it is necessary to provide two motors, or a mechanical link from a single motor to both of the mechanically variable tuning capacitors in the radio.

It is an object of this invention to provide an electronic pushbutton tuning system which does not require the use of any mechanical driving means, which is functional with a combination AM/FM radio, and which is capable of tuning in any available station by means of a single pushbutton.

SUMMARY OF THE INVENTION

In accordance with the invention, I provide an electronic search-tuning circuit for use with a radio having voltage variable capacitors in its tuning circuits. The output of a ramp generator which yields a periodic signal is applied to the control electrode of the voltage variable capacitors to sweep the capacitors through their capacitance range and thereby sweep the tuner through its frequency range.

When the radio being tuned is an FM radio, then a ratio detector is employed in the IF strip and the S-curve output of the ratio detector is coupled to control the ramp generator. The S-curve is produced by the ratio detector each time the tuning capacitor is varied through a station, and the crossover point of the S-curve is reached when a station is tuned in exactly. Therefore, for each successive station which is tuned in, the ramp generator output is held constant at said crossover point in order to hold constant the capacitance of the voltage variable capacitors so that the radio remains tuned to the station. If the output voltage of the generator starts to change, the S-curve output varies from its crossover point and drives the generator output voltage back to its proper value. This relationship provides an automatic frequency control for the system and when a station is tuned in it is automatically held. A pushbutton switch is coupled to the input of the ramp generator to block out the ratio detector signal thereby permitting the ramp generator to continue to charge toward its peak voltage when a different station is desired. Accordingly, when the pushbutton is released and the next station is reached, the output signal from the ratio detector again stops the ramp generator output and locks in the new station corresponding to the voltage output of the ramp generator. When the ramp voltage increases past the value corresponding to the highest frequency FM station, the generator is reset automatically to begin its next cycle.

Similarly, in the case of an AM radio voltage variable capacitors are used in the tuning circuit and are controlled by the same ramp generator. The IF frequency signal of the AM receiver, which is produced when a station is tuned in, is coupled through to a detector which applies a bias voltage to the ramp generator causing it to cease its increasing output and to provide a steady voltage to the voltage variable capacitors. Again, a pushbutton switch is connected to remove the detected IF signal when it is desired to change stations. By depressing the switch, the bias from the detector is removed from the ramp generator thereby permitting the ramp generator to continue its charge toward its peak voltage. The ramp voltage will again reach a plateau at the first station encountered after the pushbutton switch is released.

BRIEF DESCRIPTION OF THE DRAWING

The accompanying drawing illustrates the invention.

In such drawing.

DETAILED DESCRIPTION OF THE PREFERRED EMBODIMENT

Figure 1:
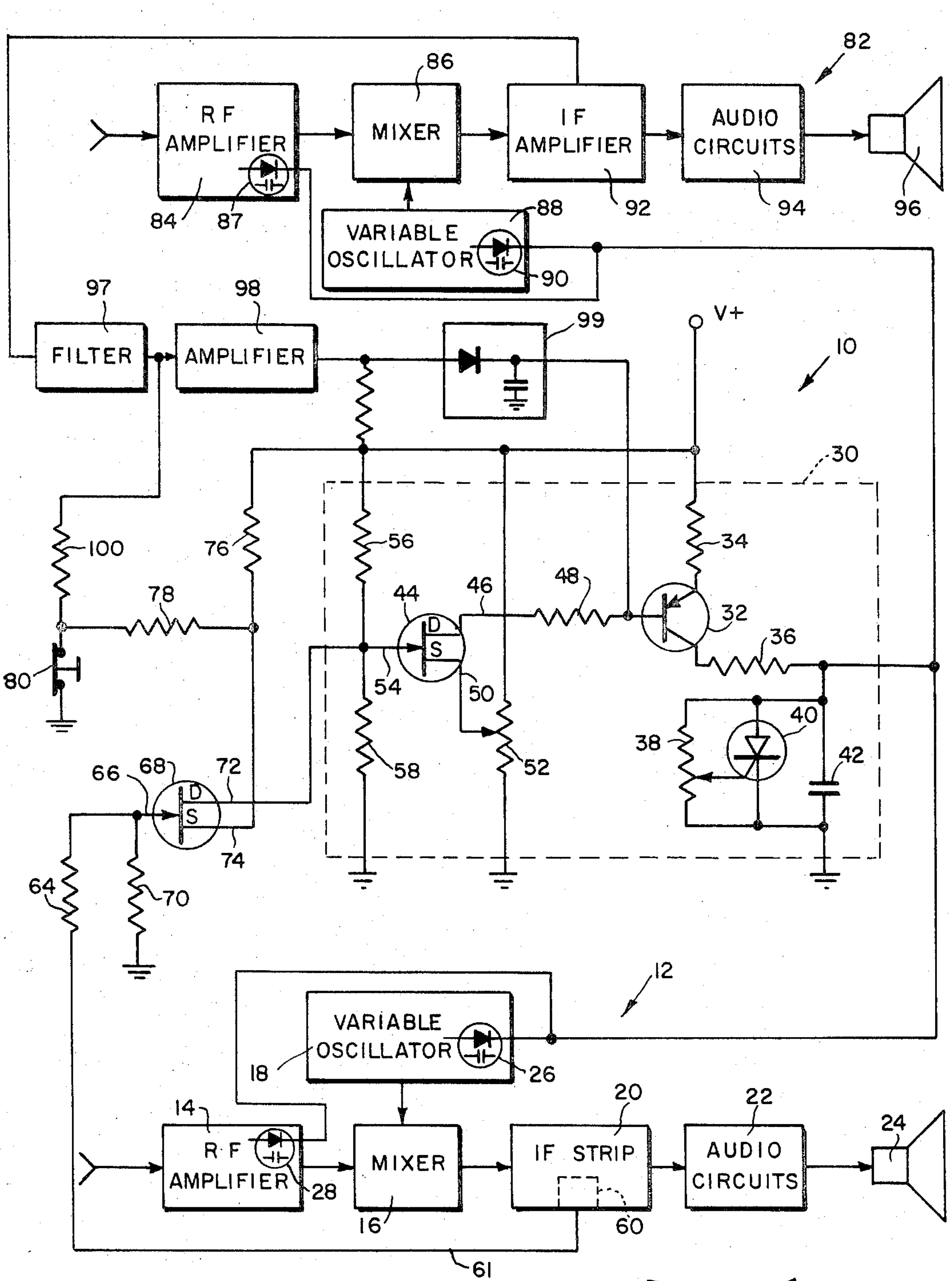
FIG. 1 is a schematic diagram of a circuit embodying this invention, and showing conventional AM and FM receiver circuitry connected thereto.

As shown in the drawing, there is provided an electronic search tuning circuit 10 adapted for use with an AM and/or an FM radio. An FM radio 12 typically comprises an RF amplifier 14 coupled to a mixer 16 which has a second input from a variable oscillator 18. The output of the mixer 16 is coupled to an IF amplifier 20 whose output is coupled through a combination of audio circuits 22 to a speaker 24. RF energy is applied to the amplifier 14 which has its output signal mixed by the circuit 16 with the signal from the variable oscillator 18 to produce an IF signal for each station which is picked up by the radio. As the frequency of the variable oscillator 18 is increased from its lowest value it combines with the carrier frequency of the lowest frequency station to produce the IF signal which is modulated with an information signal from said lowest frequency station. Accordingly, as the variable oscillator frequency is increased to its maximum value it causes the mixer 16 to reproduce the IF frequency at each succeeding station.

The frequency of oscillator 18 is varied by means of a voltage variable capacitance diode 26 in the oscillator's tuning circuit. Simultaneously, the frequency of the tuned circuit in the RF amplifier 14 is varied by means of a voltage variable capacitance diode 28 to provide selectivity. The variable voltage for controlling the capacitance of the diodes 26 and 28 is coupled directly from a generator 30 which produces a ramp function as its output voltage. The ramp voltage has a positive slope and increases from a value which establishes a capacitance 26 and 28 for producing the lowest necessary frequency of the oscillator 18 and corresponding frequency of the RF amplifier 14 to a value resulting in the highest necessary frequencies. The ramp generator 30 comprises a PNP transistor 32 having its emitter couple coupled through a resistor 34 to a positive source of voltage *V*+. The collector of the transistor 32 is coupled through a second resistor 36 to one side of the parallel combination of a potentiometer 38, a silicon controlled rectifier 40, and a capacitor 42. The other side of said parallel combination is grounded. Conduction of the transistor 32 is controlled by a field effect transistor 44 having its drain electrode 46 connected through a resistor 48 to the base electrode of the transistor 32. The source electrode 50 of the field effect transistor 44 is connected to the arm of a potentiometer 52 having its end leads connected from *V*+ to ground, while the gate electrode 54 of the field effect transistor is connected to a voltage divider formed by a pair of resistors 56 and 58 coupled from the voltage *V*+ to ground. Charging current for the capacitor 42 can not be conducted through transistor 32 unless its base current can flow through the field effect transistor 44. Thus, the field effect transistor 44 controls the base current of the transistor 32 to charge the capacitor 42 to provide the ramp function.

The arm of the potentiometer 38 is coupled to the gate electrode of the SCR 40 to turn the SCR on and to discharge the capacitor 42 when the voltage across the potentiometer reaches the desired peak value of the ramp voltage. The current through the SCR 40, after the ramp capacitor 42 has discharged, is insufficient to maintain the SCR in its conductive state. Therefore, the SCR switches back to its nonconductive state and the transistor 32 commences to recharge the capacitor 42. The resultant periodic wave-form from the ramp generator continues until a radio station is received.

Figure 2:
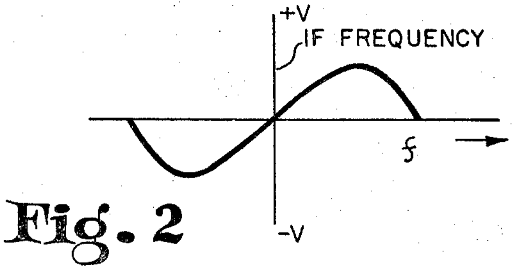
FIG. 2 is a plot of output voltage vs. frequency for a ratio detector.

The IF strip 20 is provided with a ratio detector 60 for producing an S-curve response, as shown in FIG. 2, at an output lead 61. An explanation and schematic of a representative ratio detector is found at pages 533—4, of Electronic Fundamentals and Applications, John D. Ryder, Prentice Hall 2nd Edition, 1959. As the ramp voltage from the capacitor 42 changes the value of the variable capacitors 26 and 28 the output signal from the mixer 16 approaches the IF frequency from some particular FM station. Continuation of the ramp voltage tunes the mixer output through and away from the IF frequency. During this frequency transistion the output waveform of the ratio detector 60 defines the S-curve of FIG. 2, which starts at zero and goes negative, and then changes direction to go positive, and then goes back to zero. The zero crossover point of the voltage, as it goes from negative to positive, occurs at the IF frequency and therefore it is desirable to tune each station at the crossover point of its resultant S-curve. Therefore, in FIG. 2, the Y-axis represents a DC voltage out of the IF strip ratio detector, and the X-axis represents frequency above and below the IF frequency.

An output lead 61 from the ratio detector 60 is coupled through a resistor 64 to the gate electrode 66 of a second field effect transistor 68. Another resistor 70 is coupled from the gate electrode 66 to ground, and it combines with resistor 64 to function as a voltage divider for the ratio detector output voltage which is used to bias the gate of the field effect transistor 68. The drain electrode 72 of the field effect transistor 68 is connected directly to the gate electrode 54 of the first field effect transistor 44, said gate 54 being connected to the voltage divider formed by resistors 56 and 58 as described above. The source electrode 74 of the second field effect transistor 68 is connected to the junction of another voltage divider formed by resistors 76 and 78. The other end of resistor 76 is connected to V+, and the other end of resistor 78 is connected to ground through a normally closed switch 80. The second field effect transistor 68 serves as a DC amplifier for the ratio detector output and draws its drain current through the resistor 56 to control the bias voltage at the gate 54 of the first field effect transistor 44. The purpose of the switch 80 is to release the field effect transistors from the control of the ratio detector when the switch is opened so that the charging capacitor 42 may seek the next higher frequency station.

In the operation of the tuning circuit 10, the voltage of the charging capacitor is applied to the voltage variable capacitance diode 26 in the variable oscillator 18 and to the voltage variable capacitance diode 28 in the RF amplifier 14. The carrier frequencies of various stations are picked up and passed through the RF amplifier and applied to the mixer 16. The output of the variable oscillation 18 is also applied to the mixer with the result that the output of the mixer carries the program of a particular station when the difference between the variable oscillator frequency and one of the carrier frequencies is equal to the IF frequency of the system. The output lead 61 of the ratio detector 60 in the IF strip 20 carries the S-curve shown in FIG. 2, and the ratio detector output has a quiescent voltage when the IF frequency is not produced by the mixer, which quiescent voltage is applied to the voltage divider formed by the resistors 64 and 70 to cause the second field effect transistor 68 to conduct at a predetermined level. The conduction of current into the drain electrode 72 is drawn through the voltage divider resistor 56 in the bias circuit for the first field effect transistor 44. The constant voltage at said gate electrode 54 causes the field effect transistor 44 to conduct at a constant rate thereby drawing current from the base of the transistor 32 and causing said transistor to conduct through the charging capacitor 42 thereby producing the above described ramp voltage applied to the voltage variable capacitance diodes. As the ramp voltage increases the RF amplifier 14 is tuned by its diode 28 to provide frequency selectivity in its amplification, and the variable oscillator 18 is tuned by means of its diode 26 thereby applying a varying frequency to the mixer. At the beginning of the charge cycle of the capacitor 42 the oscillator and carrier frequencies are combined by the mixer to produce an IF frequency which causes the S-curve voltage to start in the negative direction. The negatively directed S-curve voltage decreases the conduction of the field effect transistor 68 which in turn increases the voltage at the drain electrode 72 of the field effect transistor 78 since there is a smaller voltage drop across resistor 56. This increased voltage is seen at the gate electrode 56 of the field effect transistor 44 causing the latter to increase its conduction thereby causing a greater charging current to flow through the capacitor 42 and transistor 32. The more rapid charging rate of the capacitor 42 drives the variable oscillator to cause the IF center frequency to be approached at a faster rate thereby further increasing the negative voltage out of the ratio detector in a regenerative manner. As the ratio detector output starts to go positive, the field effect transistor 68 begins to conduct more heavily thereby decreasing the conduction of the field effect transistor 44 and slowing down the charging rate of the capacitor 42. Finally, the positive voltage out of the ratio detector causes the field effect transistors 68 and 44 to increase and decrease their conduction, respectively, to the extent that the conduction through the charging transistor 32 is sufficient to maintain the charging capacitor 42 at a constant voltage level. Therefore, if the capacitor begins to charge to a greater value the output from the ratio detector will increase thereby further limiting the current through transistor 32 so that the capacitor 42 would discharge through the potentiometer 38. If, on the other hand, the capacitor 42 begins to discharge, the output voltage from the ratio detector will become less positive thereby allowing more current to flow through field effect transistors 68 and 44, and through charging transistor 32 so that the charging capacitor 42 will be driven back to its equilibrium voltage level. Thus, the tuning circuit serves as an AFC circuit by means of the ratio detector output, and it is not necessary to apply an AFC signal to the front end of the FM receiver 12. That is, when a station is approached the circuit causes the station to "snap" into an accurately tuned frequency and stay accurately tuned regardless of whether the carrier frequency drifts away from its proper value. When it is desirable to tune the FM radio to a higher frequency station, the normally closed switch 80 is actuated so that the field effect transistor 68 ceases its conduction since its source lead is connected through resistor 76 to V+ thereby applying a minus-to-plus bias on the gate to source junction. The absence of current through field effect transistor 68 causes a greater conduction in the field effect transistor 44 thereby drawing a greater current from the base of transistor 32. This causes the charging capacitor 42 to begin its ramp charge cycle, and the release of switch 80 permits the circuit to lock in at the station having the next highest carrier frequency. The maximum capacitor voltage needed to tune the diode 26 and 28 to a value wherein the oscillator and RF amplifier pass their highest required frequency is a known value, and the potentiometer 38 and silicon controlled rectifier 40 function to reset the capacitor to zero voltage when such maximum capacitor voltage is reached. That is, the voltage on the arm of the potentiometer 38 is applied to the gate of the SCR and fires the SCR to discharge the capacitor when said maximum voltage is reached. The SCR current is insufficient to hold it in conduction after the capacitor is discharged, so that the SCR resumes its open circuit condition and the capacitor 42 resumes its charging cycle.

An AM receiver 82 is also coupled to the ramp generator 30. The AM receiver 82 comprises an RF amplifier 84 having an input from an antennna and an output to a mixer 86, said output being tuned by a voltage variable capacitance diode 87. The mixer 86 receives another input from a variable oscillator 88 also having a tuning capacitor formed by a variable voltage capacitance diode 90. Both diodes 87 and 90 are connected to be controlled by the variable voltage from the ramp generator 30. The output of the mixer 86 is coupled through an IF amplifier 92 and various audio circuits 94 to a speaker 96. An output from the IF amplifier 92 is coupled through a narrow-band filter 97 tuned to the IF frequency of the AM system, and the output of the filter is coupled through an amplifier 98 and a rectifier 99 to the base electrode of the charging transistor 32. The bias circuit of the amplifier 98 is coupled to ground through a resistor 100 and the normally closed switch 80.

In the operation of the AM receiver 82, when it is combined with the tuning circuitry 10, the antennna picks up the carrier frequencies which are applied through the RF amplifier 84 to the mixer 86. The ramp voltage output from the charging capacitor 42 is applied to the variable voltage capacitance diodes 87 and 90 in the RF amplifier 84 and variable oscillator 88. This causes the output frequency from the oscillator 88 to increase in proportion to the increasing ramp voltage thereby sweeping the oscillator and causing the mixer output to present the IF frequency to the IF amplifier 92 as the variable oscillator approaches each of the carrier frequencies on the AM band. As the IF frequency of a station is approached the IF frequency is coupled through the filter 97, the amplifier 98 and the detector 99 to the base electrode of the charging transistor 32 to apply positive voltage to said base thereby decreasing the charging current through the transistor. As the charge on the capacitor 42 begins to leak off thereby causing the variable oscillator frequency to decrease, and hence the IF frequency to decrease, the narrow band filter 97 detects a lesser amount of the IF signal thereby decreasing the voltage through the detector 99 and allowing the capacitor to recharge to the proper value for holding the variable oscillator 88 and RF amplifier 84 at frequencies which accurately produce the IF frequency. Again, when it is desired to tune to a different station, the switch 80 is opened thereby cutting off the amplifier 98 by removing its bias to ground through resistor 100. Disabling the amplifier 98 effectively removes the positive bias from the base electrode of the charging transistor 32. This allows the transistor 32 to resume its charging cycle to restart the ramp function on the capacitor 42. The capacitor 42 will continue to charge until the switch 80 is allowed to close and the next higher frequency station is tuned in by the variable oscillator 88 and RF amplifier 84.

Therefore, a single tuning circuit 10 is coupled to an AM receiver 82 and/or an FM receiver 12 to allow the receivers to be electronically tuned without the use of motors or mechanical driving means.

I claim:

1. An electronic search-tuning system for a receiver assembly comprising, a generator including a capacitor and a charge controlling transistor coupled in series for allowing current flow to charge the capacitor to produce a ramp function, tuning means for the receiving assembly, said tuning means being electrically connected to said generator and being sensitive to tune the receiver through a predetermined frequency range in response to said ramp function.

2. The invention as set forth in claim 1 in which said receiving assembly comprises an FM receiver having an IF amplifier, a ratio detector forming a part of said IF amplifier, and a DC amplifying means connected between the ratio detector output and the ramp generator, said ratio detector output being a DC voltage for controlling current conduction in said generator.

3. The invention as set forth in claim 2 with the addition of a switch coupled between the DC amplifying means and a point of constant potential for actuation to cutoff the operation of said DC amplifying means.

4. An electronic search-tuning system for a receiver assembly comprising, a generator having a capacitor and a charge controlling transistor coupled in series for allowing current flow to charge the capacitor to produce a ramp function, reset means for said ramp function generator, said reset means having a potentiometer and a silicon controlled rectifier connected in parallel with each other and in parallel with said capacitor, the movable arm of said potentiometer being connected to the gate electrode of said silicon controlled rectifier for causing conduction of said silicon controlled rectifier to discharge said capacitor when the voltage across the parallel combination reaches a predetermined level, and tuning means for the receiving assembly, said tuning means being electrically connected to said generator and being sensitive to tune the receiver through a predetermined frequency range in response to said ramp function.

5. The invention as set forth in claim 4 in which said tuning means comprises a voltage-variable capacitance-diode, said receiver assembly has a variable frequency oscillator for tuning said receiver from one station to another, and said voltage-variable capacitance-diode is connected within said oscillator to vary its frequency in response to the variation in voltage of said generator.

6. The invention as set forth in claim 4 in which said tuning means comprises first and second voltage-variable capacitance-diodes, said receiver assembly has a variable frequency oscillator and tunable RF amplifier for tuning said receiver from one station to another, and said voltage-variable capacitance-diodes are connected respectively within said oscillator and amplifier for varying the frequency of the oscillator and the selectivity of the amplifier in response to the variation in voltage of said generator.

7. An electronic search-tuning system for a receiver assembly comprising, a generator for producing a ramp function, tuning means for the receiving assembly, said tuning means being electrically connected to said generator and being sensitive to tune the receiver through a predetermined frequency range in response to said ramp function, said receiver assembly comprising an AM receiver having an IF amplifier, a narrow band filter is connected to the IF amplifier and is tuned to the IF frequency of the AM receiver, and a rectifier circuit is coupled between the filter and the generator for rectifying the IF signal to form a DC bias voltage at the generator, said DC bias voltage being applied to the generator for stopping the ramp function and holding constant the generator output voltage.

8. The invention as set forth in claim 7 with the addition that a second IF amplifier is connected between said filter and said rectifier, and a switch is coupled between the second IF amplifier and a point of constant potential for actuation to cutoff the conduction of said second IF amplifier, thereby removing the generator from the control of the IF signal.

9. The invention as set forth in claim 7 in which said generator comprises a capacitor and a charge controlling transistor coupled in series for allowing current flow to charge the capacitor to produce said ramp function.

10. An electronic search-tuning system for a receiver assembly comprising, a generator having a capacitor and a charge controlling transistor coupled in series for allowing current flow to charge the capacitor to produce a ramp function, reset means for said ramp function generator, said reset means having a potentiometer and a silicon controlled rectifier connected in parallel with each other and in parallel with said capacitor, the movable arm of said potentiometer being connected to the gate electrode of said silicon controlled rectifier for causing conduction of said silicon controlled rectifier to discharge said capacitor when the voltage across the parallel combination reaches a predetermined level, said receiver assembly comprising an AM receiver having an IF amplifier, a narrow band filter is connected to the IF amplifier and is tuned to the IF frequency of the AM receiver, a rectifier circuit is coupled between the filter and the generator for rectifying the IF signal to form a DC bias voltage at the generator, said DC bias voltage being applied to the generator for stopping the ramp function and holding constant the generator output voltage, and tuning means for said receiving assembly, said tuning means being electrically connected to said generator and being sensitive to tune the receiver through a predetermined frequency range in response to said ramp function.

11. The invention as set forth in claim 10 in which said tuning means comprises a voltage-variable capacitance-diode, said receiver assembly has a variable frequency oscillator for tuning said receiver from one station to another, and said voltage-variable capacitance-diode is connected within said oscillator to vary its frequency in response to the variation in voltage of said generator.

12. The invention as set forth in claim 10 in which said tuning means comprises first and second voltage-variable capacitance-diodes, said receiver assembly has a variable frequency oscillator and tunable RF amplifier for tuning said receiver from one station to another, and said voltage-variable capacitance-diodes are connected respectively within said oscillator and amplifier for varying the frequency of the oscillator and the selectivity of the amplifier in response to the variation in voltage of said generator.

13. An electronic search tuning system for a receiver assembly comprising, a generator for producing a ramp function, tuning means for the receiving assembly, said tuning means being electrically connected to said generator and being sensitive to tune the receiver through a predetermined frequency range in response to said ramp function, said receiving assembly comprising an FM receiver having an IF amplifier, a ratio detector forming a part of said IF amplifier, and a DC amplifying means connected between the ratio detector output and the ramp generator, said ratio detector output being a DC voltage for controlling current conduction in said generator, and an AM receiver having a second IF amplifier, a narrow band filter is connected to said second IF amplifier and is tuned to the IF frequency of the AM receiver, and a rectifier circuit is coupled between the filter and the generator for rectifying the IF signal to form a DC bias voltage at the generator for stopping the ramp function and holding constant the generator output voltage.

14. An electronic search-tuning system for a receiver assembly comprising, a generator for producing a ramp function, said receiving assembly comprising an FM receiver having an IF amplifier, a ratio detector forming a part of said IF amplifier and a DC amplifying means connected between the ratio detector output and the ramp generator, said ratio detector output being a DC voltage for controlling current conduction in said generator, said generator having a capacitor and a charge controlling transistor coupled in series for allowing current flow to charge the capacitor to produce said ramp function, a first field effect transistor coupled to the base of the change controlling transistor for causing it to conduct in proportion to the amount of conduction of said first field effect transistor, a second field effect transistor connected between the first field effect transistor and the ratio detector, said second field effect transistor being connected to conduct to cause an inversely proportional current flow in the first field effect transistor, and tuning means for said receiving assembly, said tuning means being electrically connected to said generator and being sensitive to tune the receiver through a predetermined frequency range in response to said ramp function.

15. The invention as set forth in claim 14 in which said generator further comprises reset means for said ramp function generator, said reset means having a potentiometer and a silicon controlled rectifier connected in parallel with each other and in parallel with said capacitor, the movable arm of said potentiometer being connected to the gate electrode of said silicon controlled rectifier for causing conduction of said silicon controlled rectifier to discharge said capacitor when the voltage across the parallel combination reaches a predetermined level.

16. The invention as set forth in claim 15 in which said tuning means comprises a voltage-variable capacitance-diode, said receiver assembly having a variable frequency oscillator for tuning said receiver from one station to another, and said voltage-variable capacitance-diode is connected within said oscillator to vary its frequency in response to the variation in voltage of said generator.

17. The invention as set forth in claim 15 in which said tuning means comprises first and second voltage-variable capacitance-diodes, said receiver assembly has a variable frequency oscillator and tunable RF amplifier for tuning said receiver from one station to another, and said voltage-variable capacitance-diodes are connected respectively within said oscillator and amplifier for varying the frequency of the oscillator and the selectivity of the amplifier in response to the variation in voltage of said generator.